(12) United States Patent
Smit et al.

(10) Patent No.: US 8,618,478 B2
(45) Date of Patent: Dec. 31, 2013

(54) DRIFT CONTROL IN A CHARGED PARTICLE BEAM SYSTEM

(71) Applicant: FEI Company, Hillsboro, OR (US)

(72) Inventors: Casper Maria Smit, Eindhoven (NL); Johannes Antonius Maria van den Oetelaar, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/724,323

(22) Filed: Dec. 21, 2012

(65) Prior Publication Data

US 2013/0200270 A1 Aug. 8, 2013

Related U.S. Application Data

(60) Provisional application No. 61/580,504, filed on Dec. 27, 2011.

(51) Int. Cl.
*H01J 37/26* (2006.01)

(52) U.S. Cl.
CPC ..................................... *H01J 37/26* (2013.01)
USPC .......................... 250/310; 250/311; 250/443.1

(58) Field of Classification Search
USPC ........................................ 250/310, 311, 443.1
See application file for complete search history.

(56) References Cited

U.S. PATENT DOCUMENTS

| 5,315,123 | A | 5/1994 | Itoh et al. |
| 5,656,811 | A | 8/1997 | Itoh et al. |
| 5,847,821 | A | 12/1998 | Tracy et al. |
| 5,942,805 | A | 8/1999 | Winer et al. |
| 6,455,862 | B1 | 9/2002 | van der Veen et al. |
| 6,521,890 | B2 | 2/2003 | Ishitani et al. |
| 6,570,170 | B2 | 5/2003 | Moore |
| 6,573,516 | B2 | 6/2003 | Kawakami |
| 6,593,583 | B2 | 7/2003 | Iwasaki |
| 6,681,039 | B1 | 1/2004 | Roberts et al. |
| 6,709,554 | B2 | 3/2004 | Ferranti et al. |
| 6,838,380 | B2 | 1/2005 | Bassom et al. |
| 7,045,275 | B2 | 5/2006 | Lee et al. |
| 7,160,475 | B2 | 1/2007 | Scipioni |
| 7,362,452 | B2 | 4/2008 | Faber |
| 7,625,679 | B2 | 12/2009 | Sullivan et al. |
| 7,660,687 | B1 | 2/2010 | De et al. |
| 7,880,151 | B2 | 2/2011 | Wells |
| 7,880,155 | B2 | 2/2011 | Krupyshev et al. |
| 8,334,511 | B2 * | 12/2012 | Schamber et al. ............ 250/311 |
| 8,362,450 | B2 | 1/2013 | Iizuka et al. |

FOREIGN PATENT DOCUMENTS

| JP | 05-082426 | 4/1993 |
| JP | 07-333120 | 12/1995 |
| JP | 2004-253232 | 9/2004 |
| WO | 2008051937 | 5/2008 |

* cited by examiner

*Primary Examiner* — Kiet T Nguyen
(74) *Attorney, Agent, or Firm* — Scheinberg & Associates, PC; Michael O. Scheinberg; John B. Kelly

(57) ABSTRACT

A method and apparatus for reducing drift in a charged particle beam system. The method includes providing a charged particle beam column including a charged particle beam, a lens system, and a sample chamber; disposing a temperature-controlled device between the lens system and the sample chamber to control heat transfer between the lens system and the sample chamber; and controlling the temperature of the temperature-controlled device to reduce or eliminate the thermal drift of the position of a sample within the sample chamber relative to the position of the charged particle beam.

23 Claims, 4 Drawing Sheets

US 8,618,478 B2

DRIFT CONTROL IN A CHARGED PARTICLE BEAM SYSTEM

The present application claims priority from U.S. Prov. Pat. App. No. 61/580,504, filed Dec. 27, 2011, which is hereby incorporated by reference.

TECHNICAL FIELD OF THE INVENTION

The present invention relates to a method of accurately positioning a beam, such as an electron beam, ion beam or laser beam, for performing beam processing to create, modify, or image microscopic structures.

BACKGROUND OF THE INVENTION

Charged particle beams, laser beams, and neutral particle beams are used in a variety of microfabrication applications, such as fabrication of semiconductor circuitry and microelectromechanical assemblies. The term "microfabrication" is used to include creating and altering structures having dimensions of tens of microns or less, including nanofabrication processes. "Processing" a sample refers to the microfabrication of structures on that sample. As smaller and smaller structures are fabricated, it is necessary to direct the beam more precisely.

An aspect of semiconductor manufacturing that requires accurate beam positioning is the extraction of thin samples for transmission electron microscopy. Such samples are used for monitoring the semiconductor fabrication process. A thin, vertical sample, referred to as a lamella, is extracted to provide a vertical cross section of the structure.

A transmission electron microscope (TEM) allows an observer to image extremely small features, on the order of nanometers or smaller. In a TEM, a broad beam impacts the sample and electrons that are transmitted through the sample are focused to form an image of the sample.

In a scanning transmission electron microscope (STEM), a primary electron beam is focused to a fine spot, and the spot is scanned across the sample surface. Electrons that are transmitted through the sample are collected by an electron detector on the far side of the sample, and the intensity of each point on the image corresponds to the number of electrons collected as the primary beam impacts a corresponding point on the surface. This technique can allow an observer to image features of sizes below one nanometer.

For both TEM and STEM, beam positioning while preparing the thin sample is important, because the beam must not etch away the feature of interest, yet the sample must be sufficiently thin to allow many of the electrons in the primary beam to travel though the sample and exit on the opposite site. Samples are typically less than 100 nm thick.

Therefore, accurate beam placement in electron microscopy and microfabrication applications is required. It has been found, however, that the impact point of a beam on a sample tends to drift over time. That is, when the operator instructs the system to position the beam at point P1, the beam actually ends up at position P2 a short time later. The difference between the coordinates of the points P1 and P2 is referred to as drift. The drift, including beam drift, stage drift, and sample drift, can be caused by thermal instabilities that cause slight movement of the stage on which the sample is positioned or of the elements that generate and focus the beam.

FIG. 1 shows a diagram of a prior art charged particle beam column used in a typical charged particle beam system for imaging or microfabrication. Charged particle source 102 provides charged particles, such as electrons or ions, that are used to form the beam. Condenser lens system 104 draws the charged particles from source 102, forms the charged particles into beam 103, and directs beam 103 toward the sample 113. Sample 113 is held in a fixed position in sample chamber 115 of column 100 by sample holder 112 and stage 110. Objective lens system 106 produces an image of sample 113 based upon the interaction of the charged particles in beam 103 with sample 113. In some charged particle systems, such as a TEM, some of the charged particles in beam 3 pass through sample 113 and are projected by projecting lens system 114 onto viewing device 116 at the bottom of column 100.

FIG. 2 shows a cross section view of an objective lens system and a sample chamber of a prior art charged particle beam column. The objective lens 106 comprises a plurality of coils 202a-202c that form an electromagnet around the axis of charged particle beam 103. Coils 202a-202c of objective lens 106 are often positioned in close proximity to the sample chamber 115. When the temperature of sample chamber 115 varies, the position of stage 110 and sample holder 112 changes relative to the poles of the electromagnet, which causes thermal drift. This thermal drift is mainly caused by coils 202a-202c of objective lens 106 being located close to sample chamber 115. Coils 202a-202c carry electric current to produce the magnetic field by which objective lens 106 operates. If the magnification of the system changes, then the amount of ampere-turns changes, which leads to a change in power dissipation and thereby a change in coil-temperature. The coil is typically mounted in close proximity to sample chamber 115 and thermal conduction will cause the temperature of sample chamber 115 to change. While the drift may be small, drift becomes more significant as smaller structures are fabricated or imaged.

One approach to preventing thermal drift is to reduce the heat transfer between the objective coils and the specimen-chamber by insulating them from each other with a layer of stagnant air, which can be a good thermal insulator. But even a layer of stagnant air is not enough to prevent drift. Other approaches have included using constant power lenses. But using constant power lenses results in extra power dissipation, oversized coils, spooling of energy and coolwater, and expensive, extremely stable power supplies capable of providing a voltage with a error of less than one part-per-million ("PPM"). For example, a 1000 Volt power supply with an error of 1 PPM (i.e., 0.001 Volt) provides a steady voltage between 999.999 Volts and 1000.001 Volts.

Another approach to compensate for thermal drift is changing the flow of water or coolant to control the temperature of the coil. However, coil temperature is not uniform, or to be more precise the outside coil temperature varies. As a result, changing the flow of water or coolant to control the temperature of the coil has not been effective at reducing thermal drift.

Yet another approach to compensate for thermal drift is using beam deflection. As the charged particle beam begins to drift, the charged particle beam can be deflected by deflecting plates or lenses within the beam column to move the beam back into proper registration. However, deflecting the beam to compensate for thermal drift reduces the performance of the beam. A better approach would be to reduce or eliminate the cause of thermal drift instead of compensating for it.

SUMMARY OF THE INVENTION

An object of the invention is to control the transfer of heat between the objective coils and the specimen chamber to reduce or eliminate thermal drift in a charged particle beam system.

In one preferred embodiment, the invention provides a method for reducing drift in a charged particle beam system. The method includes providing a charged particle beam column including a charged particle beam, a lens system, and a sample chamber; disposing a temperature-controlled device between the lens system and the sample chamber to control heat transfer between the lens system and the sample chamber; and controlling the temperature of the temperature-controlled device to reduce or eliminate the thermal drift of the position of a sample within the sample chamber relative to the position of the charged particle beam.

In another embodiment, the invention provides an apparatus for reducing drift in a charged particle beam system. The apparatus includes a temperature-controlled device disposed between a lens system of a charged particle beam column and a sample chamber of the charged particle beam column; and a temperature controller in thermal communication with the temperature-controlled device, the temperature controller comprising means for controlling heat transfer between the lens system and the sample chamber to reduce or eliminate the thermal drift of charged particle beam.

In yet another embodiment, the invention provides a charged particle beam system. The charged particle beam system includes a charged particle source; a focusing column, the focusing column including a lens system; a sample chamber, the sample chamber including a sample; and a temperature-controlled device disposed between the lens system and the sample chamber to control heat transfer between the lens system and the sample chamber.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

A preferred embodiment of the present invention controls the transfer of heat between the objective coils and the specimen chamber to reduce or eliminate thermal drift in a charged particle beam system. The charged particle beam may include, but is not limited to, an electron microscope, a scanning electron microscope (SEM), a transmission electron microscope (TEM), a scanning transmission electron microscope (STEM), a focused ion beam system (FIB), or a multiple beam system comprising more than one charged particle beam column. The heat transfer can be controlled by making use of the low thermal conductivity between the coil and the sample chamber and stabilize or add a little heat to it in such way the heat transfer is always the same amount. A simple and very effective way to control the heat transfer is to place a temperature-controlled device between the objective coil and the sample chamber so that the temperature-controlled device is insulated to both elements. The temperature-controlled device is preferably maintained at a constant temperature. The temperature-controlled device is preferably positioned to block radiant heat transfer between the objective coil. The connection between the sample chamber and the temperature-controlled device is a low thermal conductivity connection. In this way, the sample chamber is surrounded by a temperature-controlled element that is maintained at a constant temperature.

In one embodiment of the present invention, a high thermal-conductivity disc, which is thermally-controlled or stable, can be placed between the sample chamber and the objective coil to reduce drift. The high thermal-conductivity disc can be thermally connected to an external device such as a cooling and/or heating system which is external to the charged particle beam column. The cooling and/or heating system can be controlled to maintain the high thermal-conductivity disc at a constant temperature. Reducing thermal drift in this manner can substantially reduce the cost and power required compared to prior art methods for reducing thermal drift. For example, controlling the temperature of a high thermal conductivity disc in accordance with embodiments of the present invention may require as little as two watts of power and eliminates the need for expensive constant power supplies. Further, controlling the temperature of a high thermal conductivity disc in accordance with embodiments of the present invention can reduce the wait time for time to data and wait time due to drift compensation.

Figure 1:
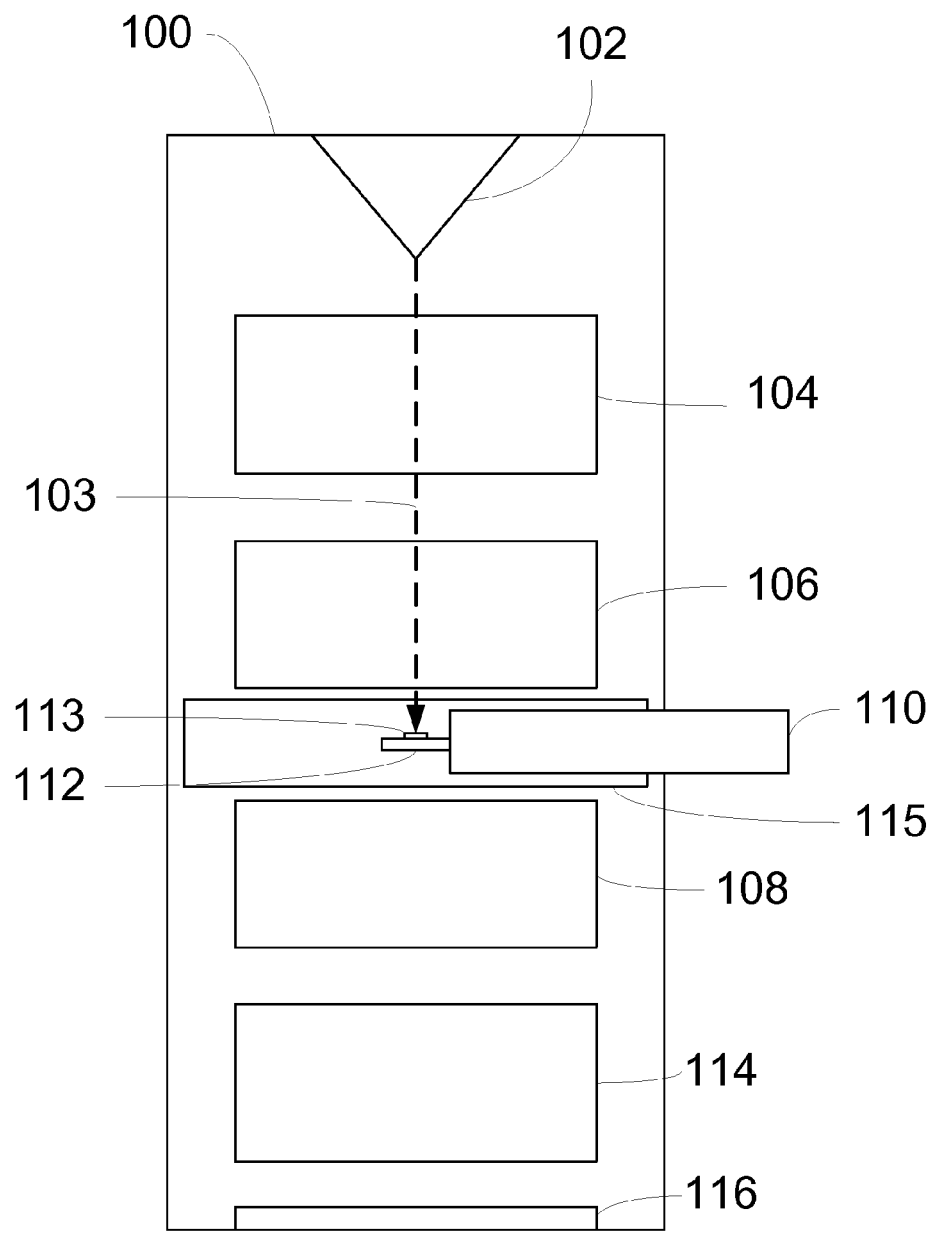
FIG. 1 shows a diagram of a prior art charged particle beam column used in a typical charged particle beam system for imaging or microfabrication.
Figure 2:
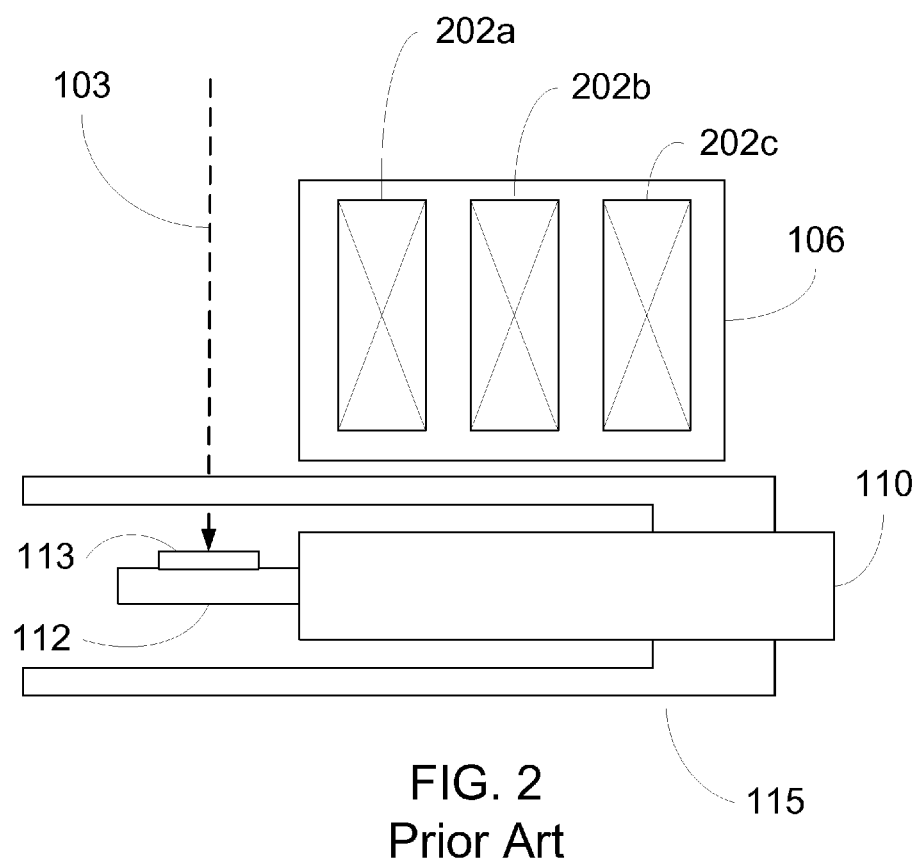
FIG. 2 shows a cross section view of an objective lens system and a specimen chamber of a prior art charged particle beam column.
Figure 3:
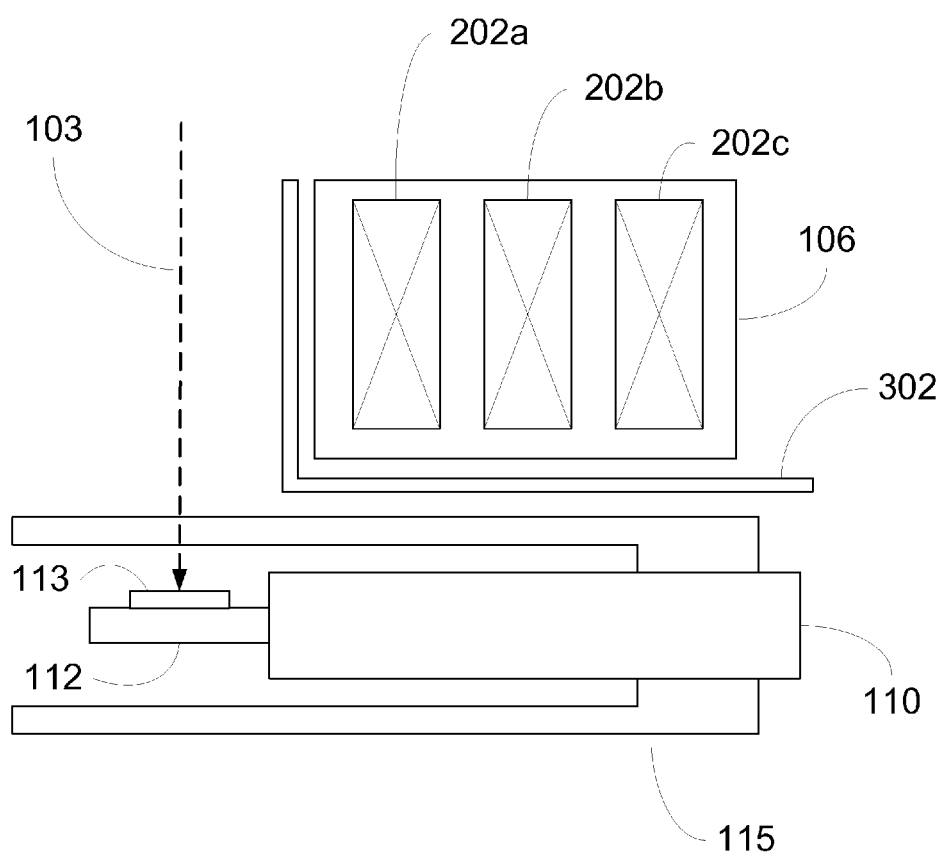
FIG. 3 shows a cross section view of an objective lens system and a specimen chamber of a charged particle beam column in accordance with one or more embodiments of the present invention.

FIG. 3 shows a cross section view of an objective lens system and a sample chamber of a charged particle beam column in accordance with one or more embodiments of the present invention. Temperature-controlled device 302 is disposed between objective lens system 106 and sample chamber 115. Temperature-controlled device 302 thermally isolates objective lens system 106 and sample chamber 115 from each other. Temperature-controlled device 302 controls the transfer of heat generated from the electric current in coils 202a-202c to sample chamber 115. Controlling the transfer of heat to sample chamber 115 enables the temperature of sample chamber 115, stage 110, and sample holder 112 to remain substantially constant during operation of the charged particle beam system, even when the current in the coils is changed to change the magnification of the system. Maintaining stage 110 and sample holder 112 at a substantially constant temperature during operation reduces or eliminates drift caused by the expansion or contraction of stage 110 and sample holder 112 relative to the position of charged particle beam 103.

Temperature-controlled device 302 can be made of any thermally stable material or any thermally conductive material that is capable of directing heat generated by coils 202a-202c of objective lens system 106 away from sample chamber 115. Preferably, temperature-controlled device 302 is mounted in the optical path between objective lens system 106 and sample chamber 110 to reduce or eliminate radiative and/or conductive heat transfer between objective lens system 106 and sample chamber 110. Temperature-controlled device 302 is preferably insulated from sample chamber 110 to reduce the heat transfer due to conduction and convection. For example, temperature-controlled device 302 can be insulated by an air gap filled with high-R air in the space between sample chamber 110 and temperature-controlled device 302.

Figure 4:
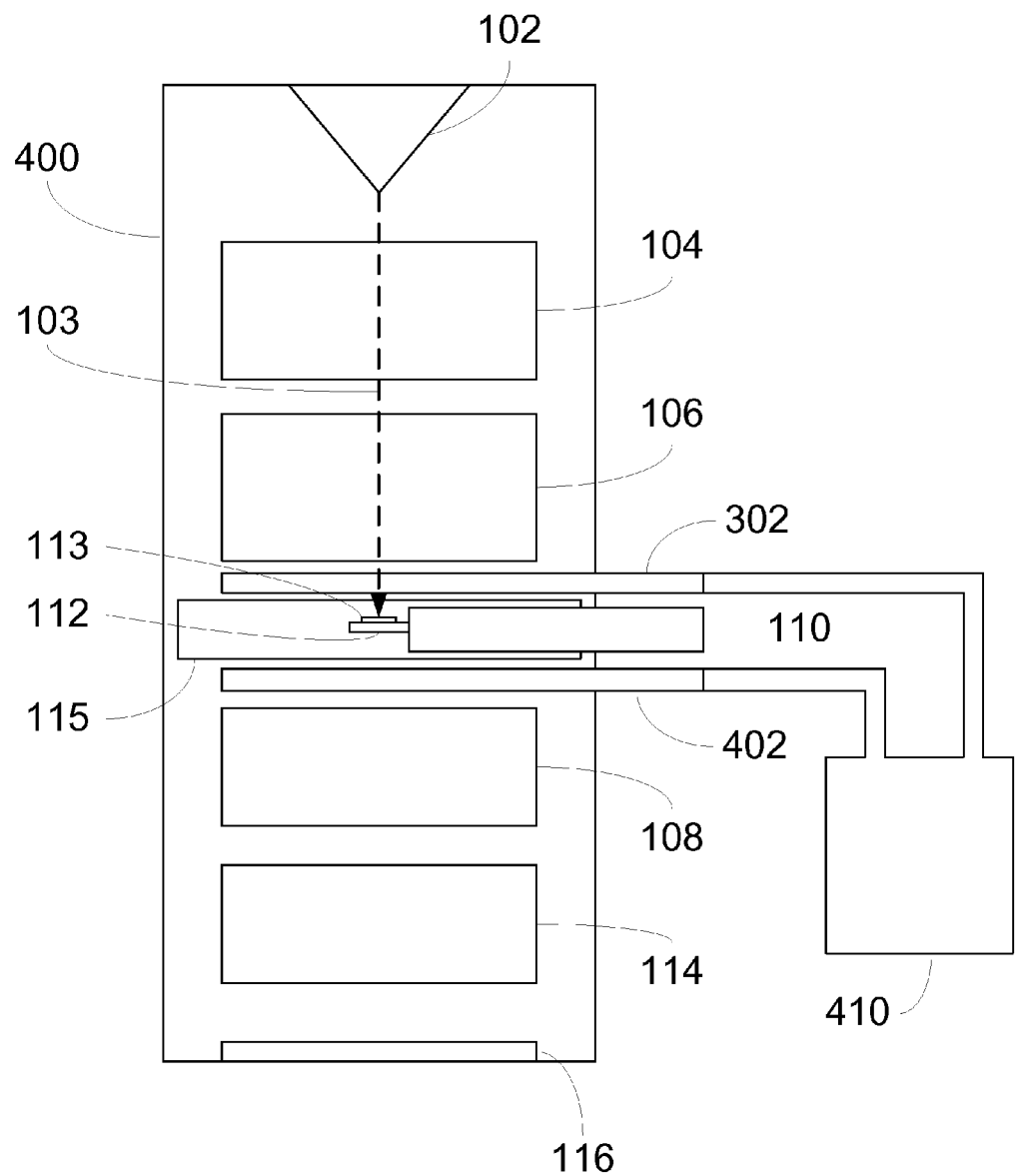
FIG. 4 shows a diagram of a charged particle beam system suitable for implementing one or more embodiments of the present invention.

FIG. 4 shows a diagram of a charged particle beam column 400 suitable for implementing one or more embodiments of the present invention. Charged particle source 102 provides charged particles, such as electrons or ions, that are used to form the beam. Condenser lens system 104 draws the charged particles from source 102, forms the charged particles into beam 103, and directs beam 103 toward the sample 113. Sample 113 is held in a fixed position within column 400 by sample holder 112 and stage 110. Objective lens system 106 produces an image of sample 113 based upon the interaction of the charged particles in beam 103 with sample 113. In some charged particle systems, such as a TEM, some of the charged particles in beam 103 pass through sample 113 and are projected by projecting lens system 114 onto viewing device 116 at the bottom of column 400.

Temperature-controlled device 302 is disposed between objective lens system 106 and sample chamber 115 to control heat transfer between objective lens system 106 and sample chamber 115, including stage 110, sample holder 112, and sample 113. Temperature-controlled device 302 is preferably thermally coupled to temperature controller 410. Temperature controller 410 is a device that can be selectively used as a heat sink for the waste heat generated by the coils of objective lens system 106. By selectively directing the waste heat generated by the coils of objective lens system 106 to temperature controller 410 instead of sample chamber 115, sample chamber 115 can be maintained at a substantially constant temperature, reducing or eliminating thermal drift in the position of sample 113 relative to the position of charged particle beam 103. Temperature controller 410 maintains temperature controlled device 302 preferably at a temperature no less than 7 degrees Celsius and no more than 35 degrees Celsius, more preferably at a temperature no less than 12 degrees Celsius and no more than 30 degrees Celsius, and most preferably at a temperature no less than 17 degrees Celsius and no more than 25 degrees Celsius. Temperature controller 410 maintains temperature controlled device 302 preferably at a temperature that is no more than 5 degrees Celsius of the temperature of the sample chamber and no less than 5 degrees Celsius of the temperature of the sample chamber. Temperature controller 410 maintains temperature controlled device 302 most preferably at the same temperature as the temperature of the sample chamber.

In an alternative embodiment, temperature controller 410 can also be selectively used as a heat source. By selectively directing the heat generated by temperature controller 410 to the sample chamber 115, sample chamber 115 can be brought up to operating temperature more quickly, thereby reducing the wait time for collecting data. Temperature controller 410 is preferably a device that is external to charged particle column 400.

For example, temperature controller 410 can be a radiator that conducts waste heat from temperature-controlled device 302 and discharges the waste heat into the ambient air by means of convection or forced convention. Alternatively, temperature controller 410 can include a chiller system or a refrigeration system capable of receiving sufficient waste heat from temperature-controlled disc 302 to maintain sample chamber 115 at a substantially constant temperature. Temperature controller 410 preferably includes a thermostat or similar device to regulate the temperature of temperature-controlled disc 302. Regulating the temperature of temperature-controlled disc 302 comprises removing waste heat from temperature-controlled disc 302. Regulating the temperature of temperature-controlled disc 302 can also include supplying heat generated by temperature controller 410 to temperature-controlled disc 302.

For charged particle beam systems, such as a TEM system, that have a lens system 108 mounted directly beneath sample chamber 115, temperature-controlled device 402 is disposed between lens system 108 and sample chamber 115 to control heat transfer between lens system 108 and sample chamber 115. Temperature-controlled device 302 and temperature-controlled device 402 can both be used in the same system if sample chamber 115 needs to be thermally isolated from lenses or other heat-generating elements that are a source of thermal drift in the system.

The term "substantially constant temperature" as used herein means a temperature with no variation, or a temperature with a variation sufficiently small so that there is no thermal drift in the system due to the temperature variation, or a temperature with a variation sufficiently small so that that the thermal drift in the system due to the temperature variation is within acceptable limits for the analysis that is being performed by the system. In a preferred embodiment, thermal drift is not greater than 0.5 nanometers per minute. In a more preferable embodiment, thermal drift is not greater than 0.1 nanometers per minute.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method for reducing drift in a charged particle beam system, the method comprising:
    providing a charged particle beam column including a charged particle beam, a lens system, and a sample chamber;
    disposing a temperature-controlled device between the lens system and the sample chamber to control heat transfer between the lens system and the sample chamber; and
    controlling the temperature of the temperature-controlled device to reduce or eliminate the thermal drift of the position of a sample disposed within the sample chamber relative to the position of the charged particle beam.

2. The method of claim 1 in which controlling the temperature of the temperature-controlled device further comprises maintaining the temperature-controlled device at a substantially constant temperature.

3. The method of claim 2 in which maintaining the temperature-controlled device at a substantially constant temperature further comprises maintaining the temperature-controlled device between 17 degrees Celsius and 25 degrees Celsius.

4. The method of claim 1 in which controlling the temperature of the temperature-controlled device further comprises maintaining the temperature-controlled device at a temperature within 5 degrees Celsius of the temperature of the sample chamber.

5. The method of claim 1 in which controlling the temperature of the temperature-controlled device further comprises maintaining the temperature-controlled device at a temperature that is substantially the same as the temperature of the sample chamber.

6. The method of claim 1 in which the thermal drift of the particle beam is no more than 0.5 nanometers per minute.

7. The method of claim 1 in which the thermal drift of the particle beam is no more than 0.1 nanometers per minute.

8. The method of claim 1 in which controlling the temperature of the temperature-controlled device further comprises directing heat from the temperature-controlled device to a heat sink.

9. The method of claim 1 in which controlling the temperature of the temperature-controlled device further comprises directing heat from a heat source to the temperature-controlled device.

10. The method of claim 1 further comprising disposing a layer of insulating air between the sample chamber and the temperature-controlled device.

11. The method of claim 1 in which the charged particle beam system comprises an electron microscope, a scanning electron microscope, a transmission electron microscope, or a focused ion beam system.

12. An apparatus for reducing drift in a charged particle beam system, the apparatus comprising:
 a temperature-controlled device disposed between a lens system of a charged particle beam column and a sample chamber of the charged particle beam column;
 a temperature controller in thermal communication with the temperature-controlled device, the temperature controller comprising means for controlling heat transfer between the lens system and the sample chamber to reduce or eliminate the thermal drift of a charged particle beam.

13. The apparatus of claim 12 in which the temperature controller includes a thermostat and a heat sink.

14. The apparatus of claim 13 in which the heat sink comprises a radiator that is external to the charged particle beam system and that discharges waste heat into ambient air.

15. The apparatus of claim 13 in which the heat sink comprises a chiller unit or a refrigerator unit that is external to the charged particle beam system.

16. The apparatus of claim 12 further comprising a layer of insulating air disposed between the sample chamber and the temperature-controlled device.

17. The apparatus of claim 12 in which the charged particle beam system comprises an electron microscope, a scanning electron microscope, a transmission electron microscope, or a focused ion beam system.

18. A charged particle beam system comprising:
 a charged particle source;
 a focusing column, the focusing column including a lens system;
 a sample chamber, the sample chamber including a sample;
 a temperature-controlled device disposed between the lens system and the sample chamber to control heat transfer between the lens system and the sample chamber; and
 a temperature controller in thermal communication with the temperature-controlled device to control the temperature-controlled device.

19. The system of claim 18 in which the temperature controller includes a thermostat and a heat sink.

20. The system of claim 19 in which the heat sink comprises a radiator that is external to the charged particle beam system and that discharges waste heat into ambient air.

21. The system of claim 19 in which the heat sink comprises a chiller unit or a refrigerator unit that is external to the charged particle beam system.

22. The system of claim 18 further comprising a layer of insulating air disposed between the sample chamber and the temperature-controlled device.

23. The system of claim 18 in which the charged particle beam system comprises an electron microscope, a scanning electron microscope, a transmission electron microscope, or a focused ion beam system.

* * * * *